US011513144B2

(12) United States Patent
Prostt et al.

(10) Patent No.: US 11,513,144 B2
(45) Date of Patent: Nov. 29, 2022

(54) PROTECTION SYSTEM FOR AN ELECTRIC METER

(71) Applicant: Landis+Gyr Innovations, Inc., Alpharetta, GA (US)

(72) Inventors: Douglas Eduardo Becker Prostt, Cajuru (BR); Geraldo Kosel, Paraná (BR); João Melo, Paraná (BR); Lucas Weber, Paraná (BR)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 155 days.

(21) Appl. No.: 16/995,102

(22) Filed: Aug. 17, 2020

(65) Prior Publication Data

US 2021/0055335 A1 Feb. 25, 2021

Related U.S. Application Data

(60) Provisional application No. 62/890,139, filed on Aug. 22, 2019.

(51) Int. Cl.
*G01R 22/06* (2006.01)
*H02H 9/04* (2006.01)

(52) U.S. Cl.
CPC ............. *G01R 22/066* (2013.01); *H02H 9/04* (2013.01)

(58) Field of Classification Search
CPC ............... G01R 11/02; G01R 11/24; G01R 22/06–068; H02H 9/04; H02H 9/041; H02H 9/06
See application file for complete search history.

(56) References Cited

U.S. PATENT DOCUMENTS

| 2002/0080545 | A1* | 6/2002 | Slater | H02H 9/042 |
| | | | | 361/106 |
| 2003/0025493 | A1* | 2/2003 | Fye | G01R 22/065 |
| | | | | 324/156 |
| 2007/0002511 | A1* | 1/2007 | Chaudhry | H02H 9/06 |
| | | | | 361/118 |
| 2009/0034168 | A1* | 2/2009 | Seff | G01R 11/04 |
| | | | | 361/660 |
| 2012/0055393 | A1* | 3/2012 | Wang | G01K 11/12 |
| | | | | 116/207 |

(Continued)

*Primary Examiner* — Huy Q Phan
*Assistant Examiner* — David B Frederiksen
(74) *Attorney, Agent, or Firm* — Kilpatrick Townsend & Stockton LLP (57) ABSTRACT

A protection system described herein includes a first connector, a second connector, and a voltage-limiter device. The first connector is configured to connect to a first load-side terminal of an electric meter, and the second connector is configured to connect to a second load-side terminal of the electric meter. In a circuit between the first connector and the second connector, the voltage-limiter device is configured to clamp a voltage between the first and second load-side terminals at a trigger voltage, to prevent a greater voltage from reaching the electric meter when a service-disconnect switch of the electric meter is open and an external voltage greater than the trigger voltage is applied to a load side of the electric meter. The voltage-limiter device provides a conductive path in parallel with a customer premises associated with the electric meter when the voltage between first and second connectors reaches the trigger voltage.

18 Claims, 7 Drawing Sheets

(56) References Cited

U.S. PATENT DOCUMENTS

| | | | | |
|---|---|---|---|---|
| 2013/0222958 A1* | 8/2013 | Fu | ............................ | H02H 9/04 |
| | | | | 361/91.1 |
| 2014/0167905 A1* | 6/2014 | Gibbons | ................ | H01H 85/44 |
| | | | | 337/186 |
| 2015/0333499 A1* | 11/2015 | Oppenheimer | ........ | H02H 9/042 |
| | | | | 29/610.1 |
| 2018/0109047 A1* | 4/2018 | Hoang | ................... | H01R 13/73 |
| 2019/0280887 A1* | 9/2019 | Telefus | .................... | H02J 3/00 |

* cited by examiner

PROTECTION SYSTEM FOR AN ELECTRIC METER

CROSS-REFERENCE TO RELATED APPLICATIONS

The present disclosure claims priority to U.S. Provisional Application Ser. No. 62/890,139 for "Protection Device for an Electric Meter," filed Aug. 22, 2019, which is incorporated by reference herein in its entirety.

TECHNICAL FIELD

Various implementations described herein relate to electric meters and, more particularly, to protection systems for protecting electric meters from certain types of tampering.

BACKGROUND

An electric meter can include a disconnect switch that controls the flow of electrical power through the meter to a customer premises. The disconnect switch may be controlled locally or remotely to disconnect the electric meter and the associated customer premises from an electric power grid or other source of electrical power.

An electric meter could be subject to various forms of tampering, including tampering that attempts to reconnect an electric meter that has been disconnected. In one example, the tampering includes applying a high voltage to the load side of the electric meter. This type of tampering causes significant damage to the electric meter. For instance, components within the electric meter may burn or melt as a result of this tampering. When the disconnect switch melts, the disconnect switch closes, and the customer premises is reconnected to the electric power grid. In addition to damaging the electric meter, this tampering causes a resource provider associated with the meter to lose revenue because the damaged electric meter does not record or report energy consumption at the customer premises.

SUMMARY

In one implementation, a protection system for an electric meter includes a first connector, a second connector, and a voltage-limiter device. The first connector is configured to connect the voltage-limiter device to a first load-side terminal of the electric meter, and the second connector is configured to connect the voltage-limiter device to a second load-side terminal of the electric meter. In a circuit between the first connector and the second connector, the voltage-limiter device is configured to clamp a voltage between the first load-side terminal and the second load-side terminal of the electric meter at a trigger voltage, to prevent a voltage greater than the trigger voltage from reaching the electric meter when a service-disconnect switch of the electric meter is in an open state and an external voltage greater than the trigger voltage is applied to a load side of the electric meter. The voltage-limiter device provides a conductive path in parallel with a customer premises associated with the electric meter when the voltage between first connector and the second connector reaches the trigger voltage.

In another implementation, a system includes an electric meter and a protection system for the electric meter. The electric meter includes a first load-side terminal on a load side of the electric meter, a second load-side terminal on the load side of the electric meter, and a service-disconnect switch. A customer premises associated with the electric meter is connected to the electric meter between the first load-side terminal and the second load-side terminal. The service-disconnect switch is configured to have an open state such that, when the service-disconnect switch is in the open state, the electric meter is disconnected from a power grid. The protection system includes a first connector, a second connector, and a voltage-limiter device. The first connector is connected to the first load-side terminal of the electric meter, and the second connector is connected to the second load-side terminal of the electric meter. In a circuit between the first connector and the second connector, the voltage-limiter device is configured to clamp a voltage between the first load-side terminal and the second load-side terminal of the electric meter at a trigger voltage, to prevent a voltage greater than the trigger voltage from reaching the electric meter when an external voltage greater than the trigger voltage is applied to a load side of the electric meter. The voltage-limiter device provides a conductive path in parallel with the customer premises associated with the electric meter when the voltage between first connector and the second connector reaches the trigger voltage.

Yet another implementation is a method for protecting an electric meter. The method includes receiving a disconnect command at an electric meter and, responsive to the disconnect command, opening a service-disconnect switch of the electric meter. A voltage-limiter device of a protection system, connected by a first connector to a first load-side terminal of the electric meter and by a second connector to a second load-side terminal of the electric meter, clamps a voltage between the first load-side terminal and the second load-side terminal at a trigger voltage to prevent a voltage greater than the trigger voltage from reaching the electric meter when an external voltage greater than the trigger voltage is applied to a load side of the electric meter. The voltage-limiter device of the protection system provides a conductive path between the first load-side terminal and the second load-side terminal and in parallel with a customer premises associated with the electric meter when a voltage between the first connector and the second connector reaches the trigger voltage.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE FIGURES

These and other features, aspects, and advantages of the present disclosure are better understood when the following Detailed Description is read with reference to the accompanying drawings.

DETAILED DESCRIPTION

A resource provider may opt to disconnect an electric meter, also referred to as a meter, associated with a customer premises. For instance, the resource provider may decide to do so if a customer associated with the customer premises is behind in paying bills related to electrical energy usage. The resource provider may disconnect the electric meter by causing a service-disconnect switch to open. For instance, the service-disconnect switch may be a disconnect relay that the resource provider opens by sending an instruction from a central system, such as a headend system, or a field technician may perform a manual operation on the electric meter to manually open the service-disconnect switch.

An unauthorized user may attempt to close the service-disconnect switch to reconnect the customer premises to the electric power grid by tampering with the meter. Specifically, for instance, the unauthorized user may couple a tamper device to the load side of the electric meter. The tamper device may include an external transformer (i.e., external to the electric meter), such as a microwave transformer similar to the type of transformer used in a microwave oven. The tampering includes applying power to the external transformer while the external transformer is coupled to the load side of the meter. The power may be applied continuously or may be pulsed. When the energy from the external transformer is coupled to the load side of the electric meter, it causes a high voltage spike, or series of spikes, on the load side of the electric meter. The high voltage damages the electric meter and causes the contacts on the service-disconnect switch to close. As a result, the customer premises is reconnected to the electric power grid without authorization from the resource provider.

Currently, there are no existing techniques to automatically detect this kind of tampering or to prevent it. Discovery of this kind of tampering would typically require a field technician to physically observe the damage to the meter, and this would happen only after the damage has already occurred and the customer premises has potentially been using the resource through the damaged meter without being billed.

Some implementations described herein include a protection system, also referred to as a protection device, configured to protect an electric meter from this type of tampering, where the tampering could occur by an external transformer or other tamper device configured to close the service-disconnect switch by application of a high external voltage to the load side of the meter. Specifically, some implementations of the protection system include a voltage-limiter device, also referred to as a voltage limiter, in a protection circuit connected to load-side terminals of the meter and thus connected in parallel with the customer premises. The voltage-limiter device may include, for example, one or more gas discharge tubes (GDTs). The voltage-limiter device clamps the voltage on the load side to a trigger voltage, also referred to as a voltage threshold, and provides a conductive path for the external voltage applied by the tamper device, thus preventing a voltage spike at the meter itself. Further, clamping the voltage can cause the tamper device to short circuit, which can potentially reduce the chance of further tampering. As a result, the service-disconnect switch remains undamaged and open, and the customer premises remains disconnected from the electric power grid.

Figure 1:
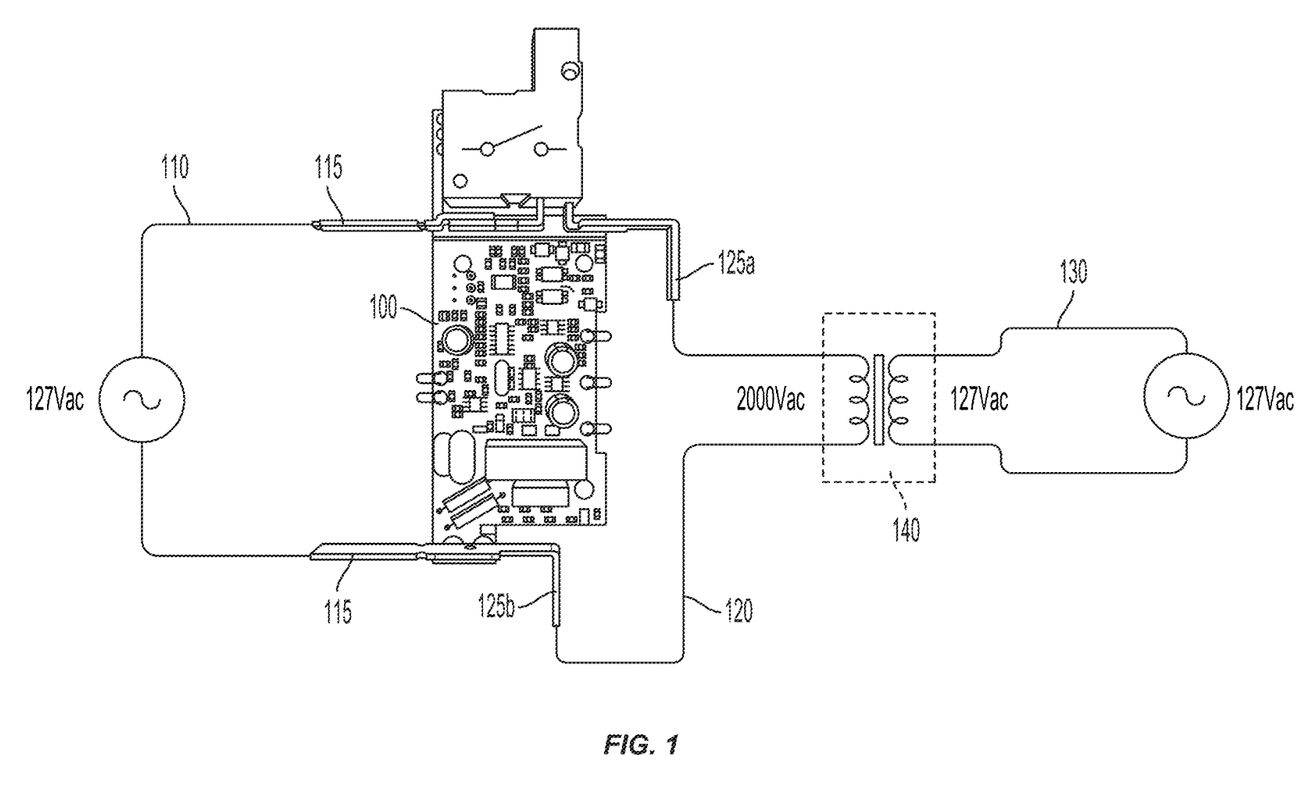
FIG. 1 is a diagram of a tampering event in which a tamper device applies an external transformer to an electric meter.

FIG. 1 is a diagram of a tampering event in which a tamper device 130 includes an external transformer 140 (i.e., external to an electric meter 100) and applies that external transformer 140 to the electric meter 100. For instance, the external transformer 140 may be a microwave transformer. Further, although the tamper device 130 shown in FIG. 1 includes an external transformer 140, other types of tamper devices 130 could be used to cause the type of tampering at issue.

As shown in FIG. 1, the meter 100 has a line side 110 and a load side 120, where the line side 110 is connected to the electric power grid and the load side 120 is connected to the customer premises. Specifically, in the example shown, two line-side terminals 115 are connected to the electric power grid via wiring, and a first load-side terminal 125a and a second load-side terminal 125b are connected to the customer premises via wiring. The external transformer 140 is applied on the load side 120, which is the side of the customer premises and is thus typically accessible by an unauthorized user, such as a customer associated with the customer premises.

When an unauthorized user powers the external transformer 140, a high voltage occurs on the load side 120 of the meter 100. In one example, as shown in FIG. 1, the voltage applied is approximately two thousand volts of alternating current power (2000 Vac), compared to the operating voltage of the meter 100, which is 127 Vac in this example. This much higher voltage damages the service-disconnect switch 130, thus causing the service-disconnect switch 130 to close. For instance, when exposed to the high voltage, the service-disconnect switch 130 can melt closed. As a result, the customer premises is reconnected to the electric power grid without authorization from the resource provider.

Figure 2:
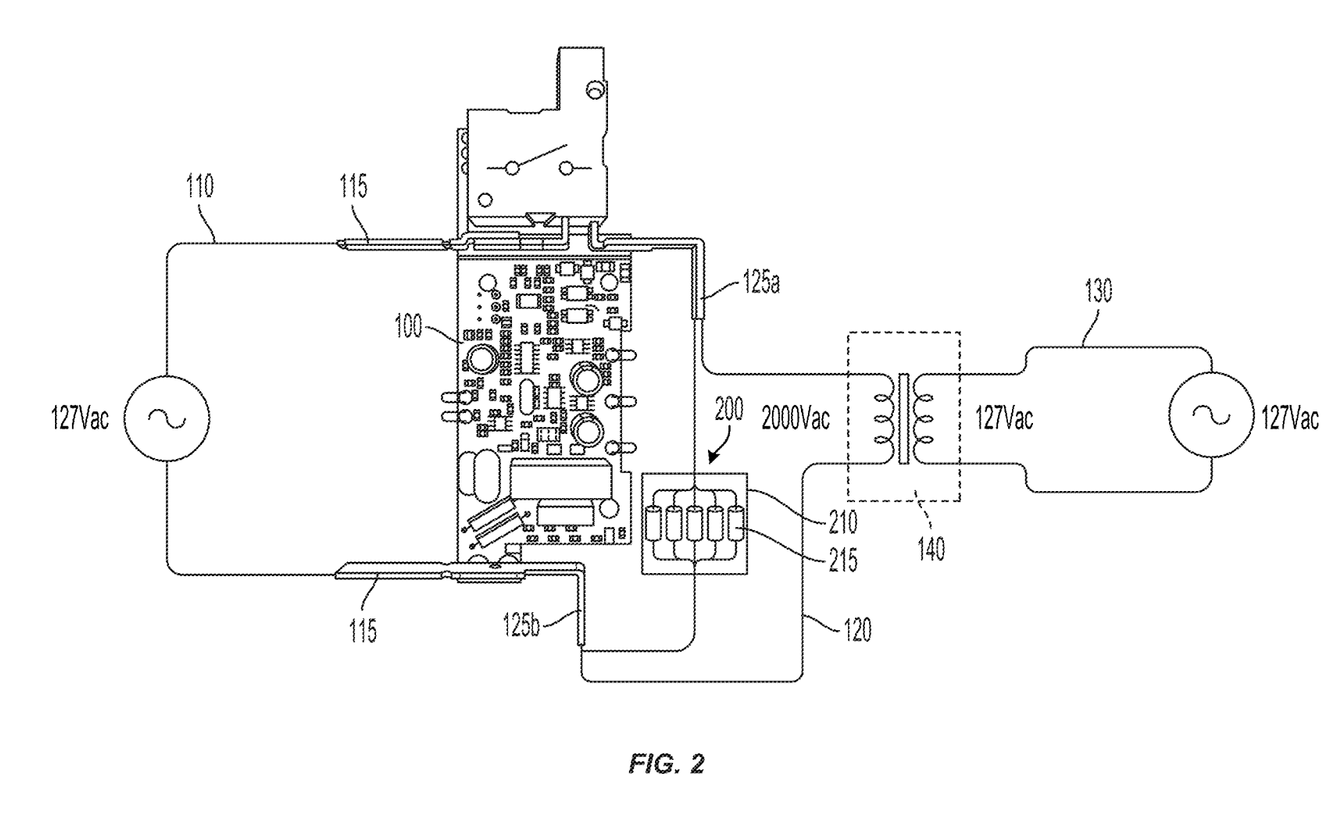
FIG. 2 is a diagram of a similar tampering event as shown in FIG. 1, except the meter 100 utilizes a protection system according to some implementations described herein.

FIG. 2 is a diagram illustrating a similar tampering event as shown in FIG. 1 except, in this example, the meter 100 utilizes a protection system 200 according to some implementations described herein. In some implementations, as shown in FIG. 2, the protection system 200 is connected on the load side 120 of the meter 100 and is connected in parallel with the customer premises. Thus, the protection system 200 forms a protection circuit. Generally, the protection system 200 clamps the voltage on the load side 120 of the meter 100 so that the voltage on the load side 120, and thus at the meter 100, remains at a value that does not damage the components of the meter 100. More specifically, through clamping the voltage in this manner, the protection system 200 protects the service-disconnect switch 130 by preventing the service-disconnect switch 130 from melting.

The protection system 200 may include a voltage-limiter device 210 that clamps the voltage on the load side 120 of the meter 100 during a tampering event. More specifically, in some implementations, the protection system 200 may include a first connector (not shown in FIG. 2), a second connector (not shown in FIG. 2), and the voltage-limiter device 210. The first connector may attach to the first load-side terminal 125a, and the second connector may attach to the second load-side terminal 125b, thus connecting the voltage-limiter device 210 on the load side 120 of the meter 100 and in parallel with the customer premises.

An example of the voltage-limiter device 210 of the protection system 200 includes one or more GDTs 215. In the case of multiple GDTs 215, the GDTs 215 may be connected in parallel with one another. Thus, the one or more GDTs 215 are connected on the load side 120 of the meter 100 and in parallel with the customer premises. In one example, as shown in FIG. 2, five GDTs 215 are connected in parallel in the protection system 200; however, other quantities of GDTs 215 may be used in other implementations. In this example, each GDT 215 is rated for a thousand kilovolts, and thus, a trigger voltage associated with each GDT 215 in this example is a thousand kilovolts. An example of a GDT 215 that can be used in some implementations is the B88069X3820S102 GDT provided by TDK Electronics, previously known as EPCOS. The number and rating (i.e., the trigger voltage) of the GDTs 215 in the protection system 200 may vary based on implementations; that number and rating may be selected based on the characteristics of the meter 100 and the environment in which the meter 100 is or will be installed. As described below, the use of multiple GDTs 215 may protect the meter 100, and specifically the service-disconnect switch 130 such that the state of the service-disconnect switch 130 (i.e., the state of being in an open position) remains constant, during multiple tamper events or from an extended tamper event.

In some implementations, during the tampering event, the protection system 200 allows the voltage at the load side 120 of the meter 100 to increase until that voltage reaches the trigger voltage of the GDTs 215 (e.g., a thousand kilovolts). When the trigger voltage is reached, the GDTs 215 clamp the voltage to a low level by providing a low impedance path for the current through an ionized contained plasma gas inside the GDTs 215. Due to the voltage being clamped, the external transformer 140 or other tamper device can short circuit due to overheating to the point of inoperability. Thus, in addition to protecting the meter 100 due to preventing a voltage spike, the protection system 200 can also short circuit the tamper device between the first load-side terminal 125a and the second load-side terminal and can thus end the tampering event due to inoperability of the tamper device after the short circuit.

In some cases, clamping the voltage may cause one or more of the GDTs 215 to fail. When a GDT 215 fails, it fails in an open position. In the case where multiple GDTs 215 are included in parallel in the protection system 200, the remaining GDTs 215 provide paths for the current and thus continue to clamp the voltage on the load side 120 of the meter 100. Thus, the protection system 200 can continue to protect the meter 100 due to the remaining GDTs 215 still being operational. As a result, the protection system 200 implemented with multiple GDTs 215 is able to protect the meter 100 through an extended tamper event or through multiple events, even as one or more of the GDTs 215 fail as a result of such one or more tamper events.

The protection system 200 may protect against a tamper device 130 that is operated in either a continuous or pulsed mode. In other words, regardless of whether the tamper device 130 applies a continuous voltage or a pulsed voltage on the load side 120 of the meter 100, the protection system 200 may be effective at protecting the meter 100 by limiting the voltage that reaches the meter 100. For instance, in an example implementation, a protection system 200 with five GDTs may successfully protect a meter 100 from four tampering events when the tamper device is continuously powered, and a protection system 200 with three GDTs may successfully protect a meter 100 from a tampering event that includes ninety pulses lasting one second each.

Although FIG. 2 illustrates GDTs used as the voltage-limiter device 210 of the protection system, other components may be used in the voltage-limiter device 210 instead of or in addition to the GDTs 215 to clamp the voltage on the load side 120. Various components capable of clamping the voltage and further capable of dissipating large amounts of energy may be used in place of or in addition to one or more GDTs 215. These components include, for example, varistors or other voltage-suppressing components.

Figure 3:
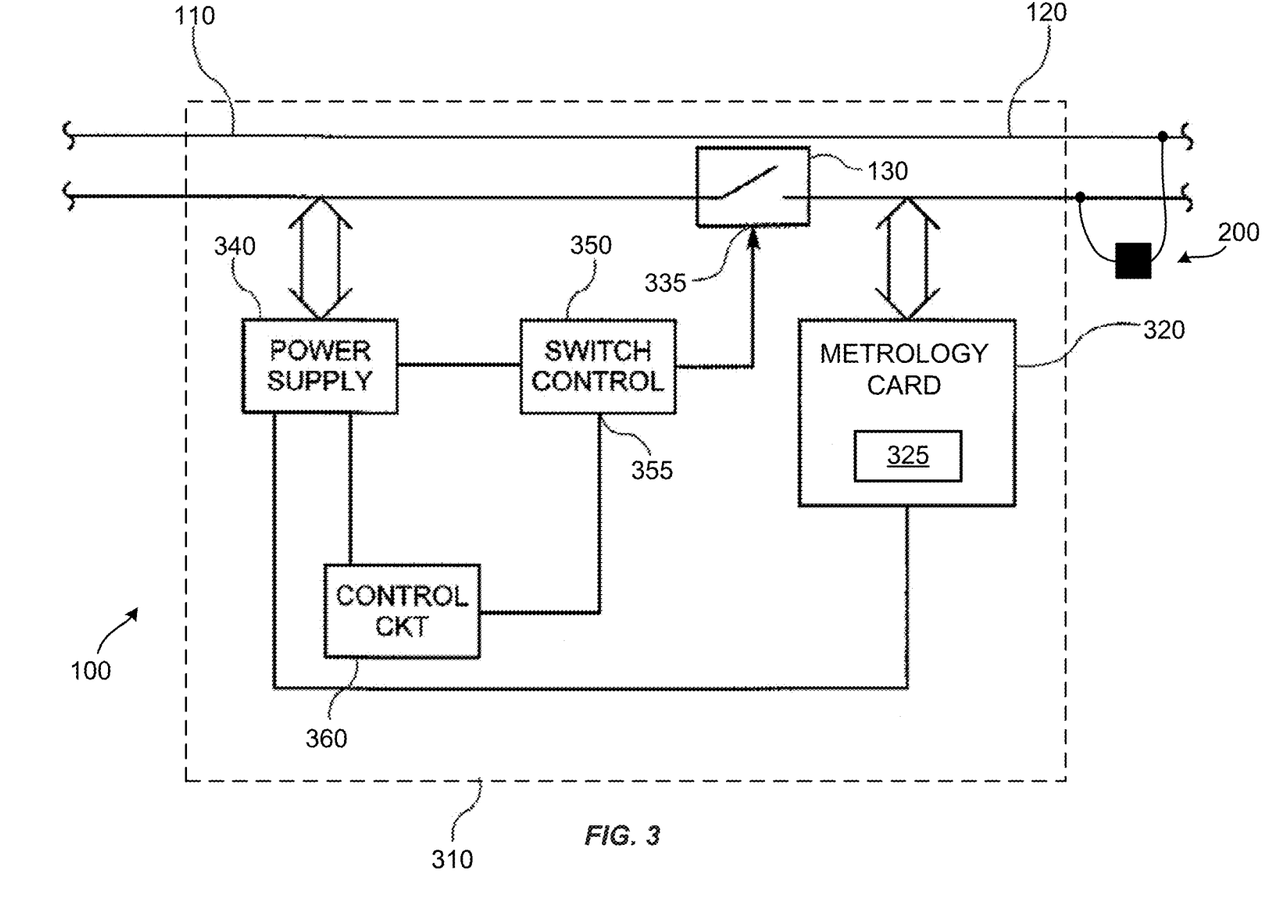
FIG. 3 is a diagram of an architecture of an example electric meter that uses a protection system, according to some implementations described herein.

FIG. 3 is a diagram of an architecture of an example electric meter 100 using a protection system 200, according to some implementations described herein. As shown in FIG. 3 and as described above, in some implementations, the protection system 200 is connected between a first load-side terminal 125a and a second load-side terminal 125b on the load side 120 of the meter 100. The meter 100 may include a housing 310, which encloses various other components of the meter 100. In the example of FIG. 3, the protection system 200 is installed outside the housing 310; however, in alternative implementations, the protection system 200 may be installed inside the housing 310 instead.

As shown in FIG. 3, the meter 100 includes a line side 110 connected to an electric power grid, and the meter 100 also includes a load side 120 connected to a load, which is a customer premises. The meter 100 includes a metrology card 320 configured to measure the use of electrical power at the customer premises and further configured to generate consumption data describing that usage. The metrology card 320 may include or have access to a communication device 325 of the meter 100, where the communication device 325 is configured to transmit the consumption data to a remote device, such as a headend system, accessible by a resource provider. The resource provider may then charge a customer according to the amount of electrical energy used as described in the consumption data. The meter 100 additionally includes a power supply 340, a service-disconnect switch 130, a switch control 350, and a control circuit 360. FIG. 3 is a non-limiting example of a meter 100, and the components shown do not limit the various implementations within the scope of this disclosure.

The power supply 340 is configured to provide power to various components of the meter 100. For instance, the power supply 340 may receive alternating current (AC) power on the line side 110 of the meter 100 and may convert that power to direct current (DC) power provided as input to internal components of the meter 100, such as the metrology card 320, the switch control 350, and the control circuit 360.

The service-disconnect switch 130 is a relay or other switch configured to controllably interrupt a connection between an electrical power service, provided through access to the electric power grid, and the customer premises. In some implementations, the service-disconnect switch 130 includes an input 335 that receives an electrical signal to open or close the service-disconnect switch 130. In some implementations, the switch control 350 is operably connected to the input 335 of the service-disconnect switch 130 to open and close the service-disconnect switch 130 by way of an output, such as an output electrical signal, provided to the input 335 of the service-disconnect switch. The switch control 350 may provide that output in response to a sensed condition in the meter 100 or in response to a disconnect command. When provided to the input 335 of the service-disconnect switch 130, the output of the switch control 350 causes the service-disconnect switch 130 to controllably interrupt the connection, or to reconnect the customer premises, to the electrical power service. In some implementations, the switch control 350 further includes a control input 355 for receiving signals suitable for controlling whether the switch control 350 causes the service-disconnect switch 130 to open or to close.

When the service-disconnect switch 130 is closed, the electrical power service is connected for the customer premises, and electrical power is delivered to the customer premises. The metrology card 320 may measure the amount of electrical energy flowing through to the load side 120 and may thereby generate consumption data.

The control circuit 360 is operably coupled to the input 335 of the switch control 350 to provide open control signals, instructing the service-disconnect switch 130 to open, and close control signals, instructing the service-disconnect switch 130 to close, for the operation of the service-disconnect switch 130. In some implementations, the control circuit 360 is a logic circuit, processor, or controller capable of carrying out the operations ascribed to it herein.

The resource provider may decide to disconnect the electrical power service at the customer premises, for instance, if the customer is behind in making payments or for troubleshooting purposes. In such a case, the control circuit 360 may receive a disconnect command from a remote device, such as from the headend system associated with the resource provider, indicating that the electrical power service is to be disconnected. In response to the disconnect command, the control circuit 360 is configured to provide an open control signal to the control input 355 of the switch control 350, thus causing the service-disconnect switch 130 to open. When the service-disconnect switch 130 is open, electrical energy cannot flow to the load side 120 from the line side 110, and the electrical power service is thereby disconnected from the customer premises.

If the resource provider later decides to reconnect the electrical power service of the customer premises, the control circuit 360 may receive a connect command from a remote device, such as from the headend system, indicating that the electrical power service is to be reconnected. In response to a reconnect command, the control circuit 360 is configured to provide a closed control signal to the control input 355 of the switch control 350, thus causing the service-disconnect switch 130 to close. When the service-disconnect switch 130 is closed, electrical energy flows to the load side 120 from the line side 110, and the electrical power service is thus connected to the customer premises.

However, while the service-disconnect switch 130 is open and thus electrical energy is not flowing to the customer premises, a tamper device 130 may be applied to the load side 120 in an attempt to damage the meter 100 and thereby reconnect the customer premises to the electrical power grid without authorization by the resource provider. Specifically, a user of the tamper device may seek to apply sufficient voltage to melt the service-disconnect switch 130 closed. However, in some implementations, the protection system 200 clamps the voltage on the load side 120 of the meter 100 and provides a conductive path for the voltage resulting from the tamper device 130, thus preventing a voltage spike at the meter 100. As a result, the meter 100, including the service-disconnect switch 130, is not damaged due to the tamper event.

Figure 4A:
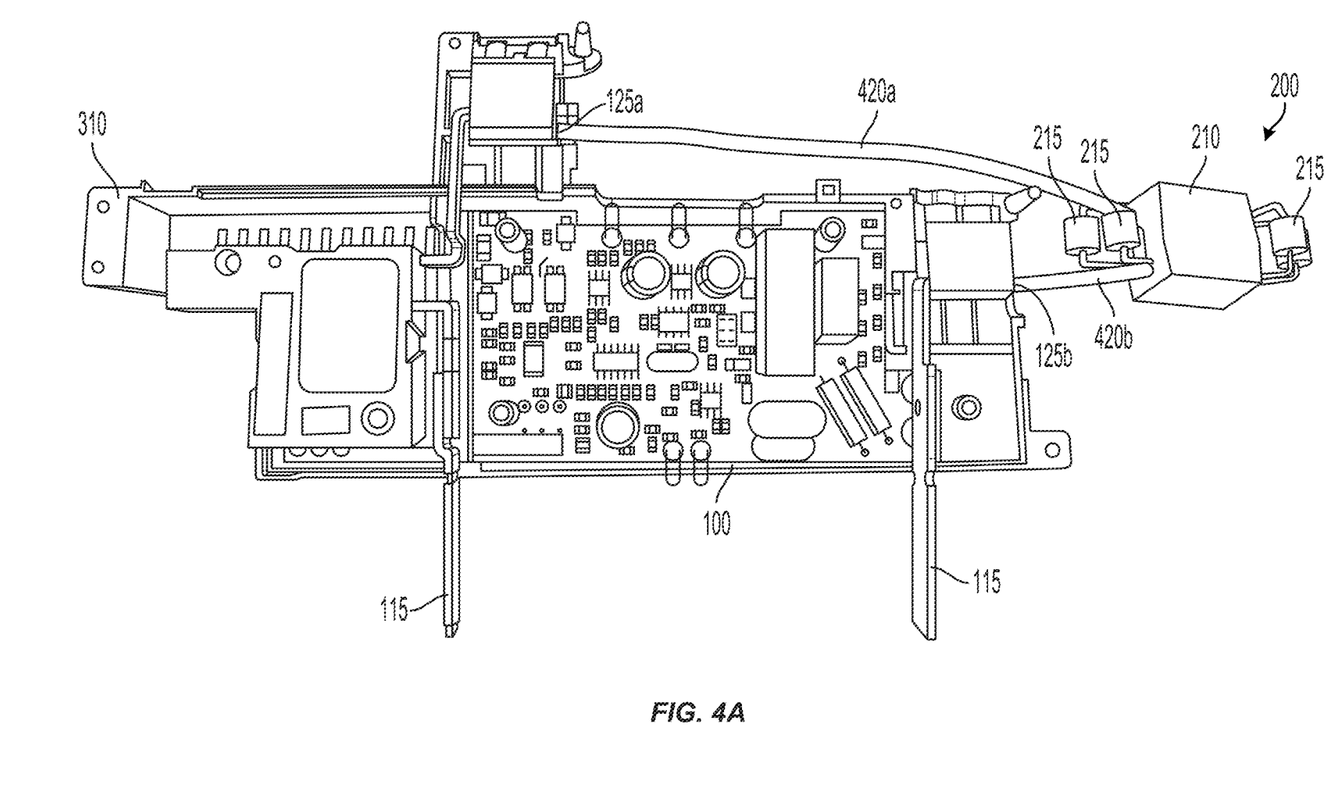
FIG. 4A illustrates a side view of an electric meter that uses a protection system, according to some implementations described herein.
Figure 4B:
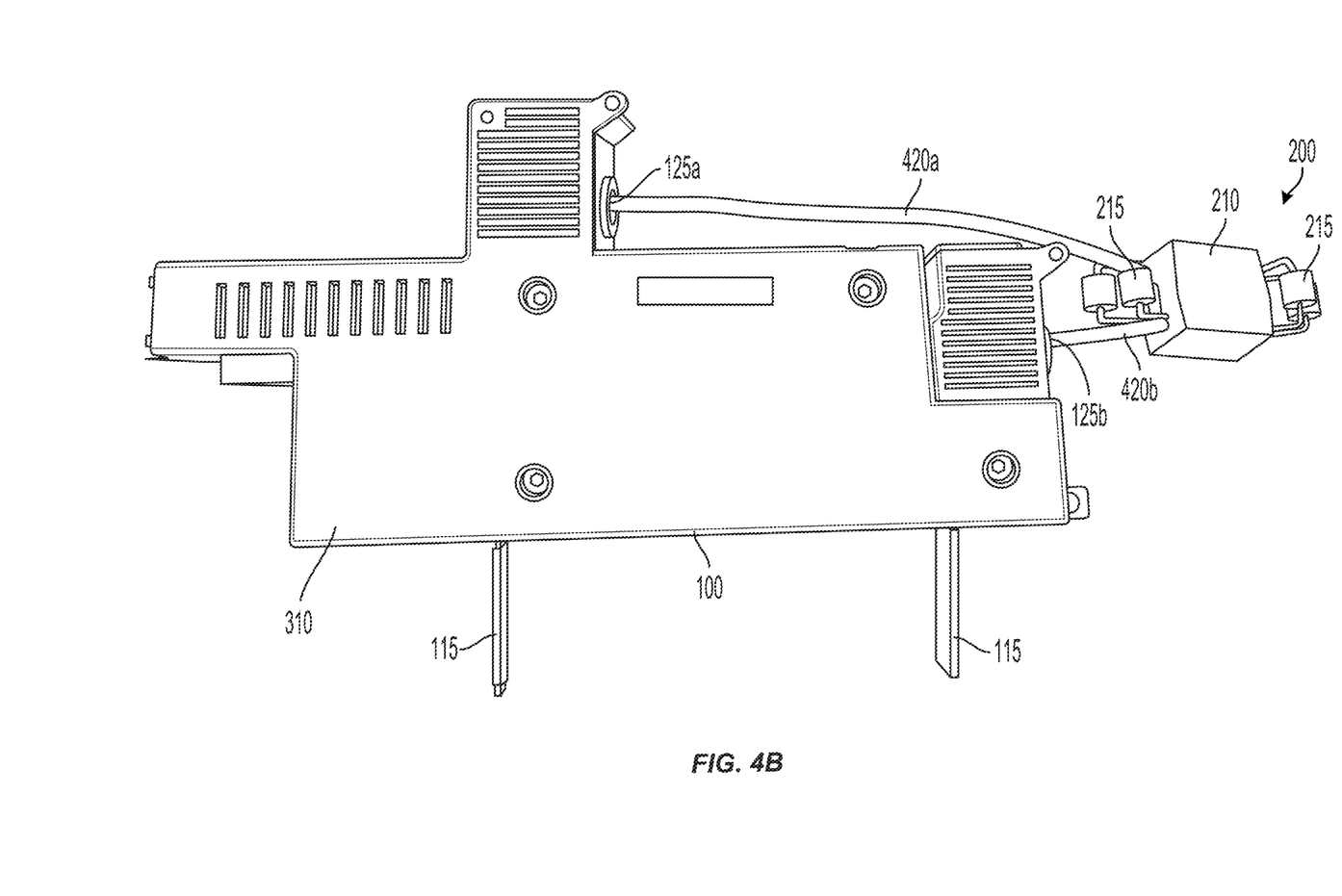
FIG. 4B illustrates another side view of an electric meter that uses a protection system, according to some implementations described herein.
Figure 4C:
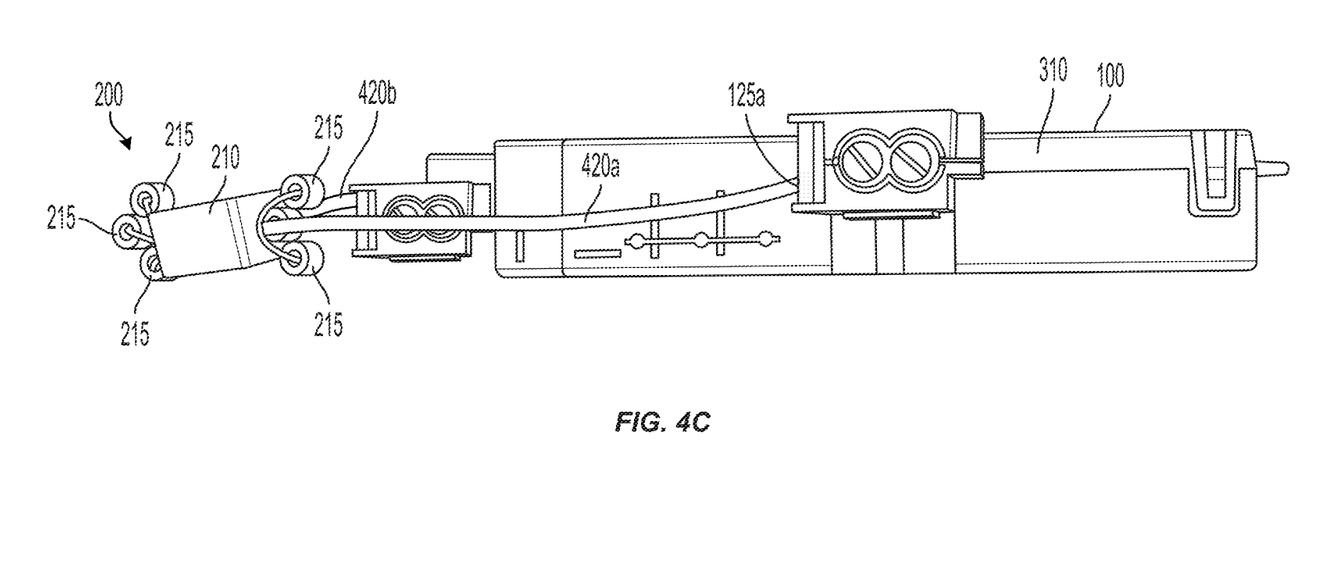
FIG. 4C illustrates a top view of an electric meter that uses a protection system, according to some implementations described herein.

FIGS. 4A-4C illustrate an electric meter 100 that uses a protection system 200, according to some implementations described herein. Specifically, FIG. 4A illustrates a side view of the meter 100 with a portion of the housing 310 removed, FIG. 4B illustrates another side view of the meter 100, and FIG. 4C illustrates a top view of the meter 100. As shown in FIGS. 4A-4C, the protection system 200 may include a first connector 420a, such as a wire, connected to a first load-side terminal 125a of the meter 100 and may further include a second connector 420b, such as another wire, connected to a second load-side terminal 125 of the meter 100. The protection system 200 may include a voltage-limiter device 210, which may include one or more GDTs 215 or other components configured to clamp the voltage on the load side 120 and to provide a conductive path for the voltage applied during a tamper event.

In the example of FIGS. 4A-4C, the protection system 200 is external to the meter 100, specifically, outside the housing 310 of the meter 100; however, in other implementations, the protection system 200 may be internal to the meter 100, such as by being positioned inside the housing 310 or by being integrated into a printed circuit board of the meter 100. The placement of the protection system 200 relative to the meter 100 and relative to the housing 310 of the meter 100 may depend on the specific design of the meter 100.

Figure 5:
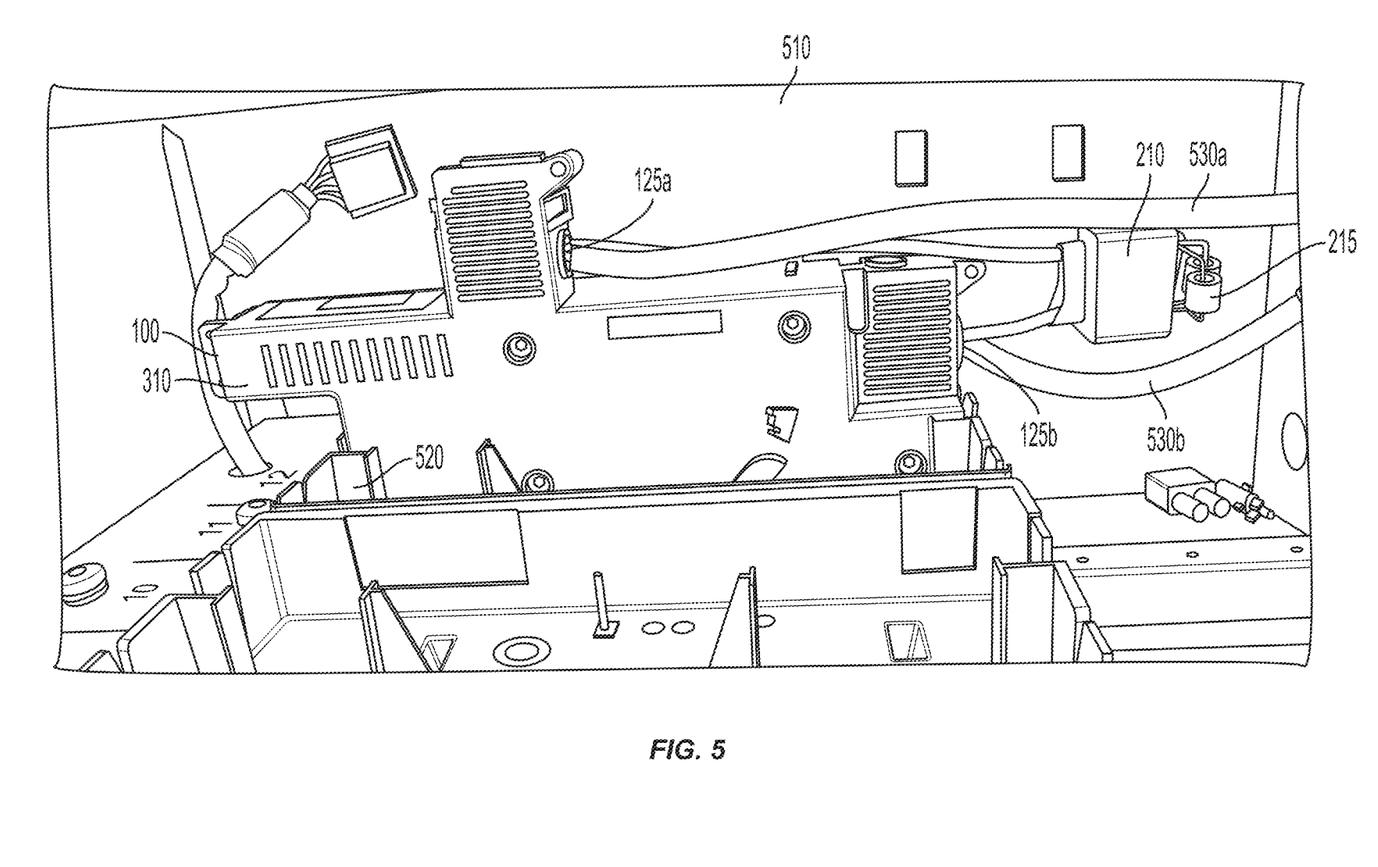
FIG. 5 illustrates the electric meter of FIGS. 4A-4C using the protection system and installed in a meter cabinet, according to some implementations described herein.

FIG. 5 illustrates the example meter 100 of FIGS. 4A-4C using the protection system 200 and installed in a meter cabinet 510. In the example of FIG. 5, the meter 100 is a cabinet meter configured to be installed in a meter cabinet 510, potentially with multiple other meters 100. Specifically, in this example, the meter 100 is installed in a meter slot 520 of the meter cabinet 510, and a first cable 530a and a second cable 530b respectively connect the first load-side terminal 125a and the second load-side terminal 125b to the customer premises in parallel with the protection system 200. In some implementations, one or more meters 100 in the cabinet may have their own respective protection systems 200 to which they are connected.

Although the example meter 100 depicted in FIGS. 4A-4C and FIG. 5 is a cabinet meter, implementations of the protection system 200 can be connected to, and can thus protect, various types of meters 100. For instance, the protection system 200 can be connected on the load side 120 of an American National Standards Institute (ANSI) meter or some other meter type. The protection system 200 may be integrated into the meter 100, such as by being incorporated into a printed circuit board or being positioned inside the housing 310, or the protection system 200 may be external to the meter 100. If the protection system 200 is outside the housing of the meter 100, the protection system 200 may be configured to prevent an unauthorized user from easily tampering with the protection system 200; for instance, the meter 100 may be configured to transmit an alert to the headend system if the protection system 200 is disconnected from the meter 100.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A protection system for an electric meter, the protection system comprising:
    a first connector of the protection system configured to connect to a first load-side terminal of the electric meter;
    a second connector of the protection system configured to connect to a second load-side terminal of the electric meter; and
    a voltage-limiter device comprising a gas discharge tube (GDT) in a circuit between the first connector and the second connector, the GDT configured to form a conductive path between the first connector and the second connector in parallel with a load on the electric meter,
    wherein the GDT of the voltage-limiter device is further configured to clamp a voltage between the first load-side terminal and the second load-side terminal of the electric meter at a trigger voltage to prevent a voltage greater than the trigger voltage from reaching the electric meter when a service-disconnect switch of the electric meter is in an open state and an external voltage greater than the trigger voltage is applied to a load side of the electric meter, and
    wherein the GDT of the voltage-limiter device provides the conductive path in parallel with the load on the electric meter when the voltage between first connector and the second connector reaches the trigger voltage.

2. The protection system of claim 1, wherein the voltage-limiter device is configured to maintain the open state of the service-disconnect switch of the electric meter in a presence of the voltage greater than the trigger voltage being applied to the load side of the electric meter.

3. The protection system of claim 2, wherein the voltage-limiter device is configured to cause a short circuit in a tamper device applied between the first load-side terminal and the second load-side terminal of the electric meter.

4. The protection system of claim 2, wherein the voltage-limiter device comprises one or more varistors.

5. The protection system of claim 1, wherein:
    the voltage-limiter device of the protection system further comprises an additional GDT in parallel with the GDT; and
    the GDT is configured to fail in an open position, wherein the additional GDT provides a second conductive path for the current in parallel with the load on the electric meter when the GDT fails.

6. The protection system of claim 1, wherein the protection system is installable outside a housing of the electric meter.

7. The protection system of claim 1, wherein the protection system is installable inside a housing of the electric meter.

8. A system comprising:
    an electric meter comprising:
        a first load-side terminal on a load side of the electric meter;
        a second load-side terminal on the load side of the electric meter, wherein a customer premises associated with the electric meter is connected to the electric meter between the first load-side terminal and the second load-side terminal; and
        a service-disconnect switch configured to have an open state such that, when the service-disconnect switch is in the open state, the electric meter is disconnected from a power grid; and
    a protection system comprising:
        a first connector of the protection system connected to the first load-side terminal of the electric meter;
        a second connector of the protection system connected to the second load-side terminal of the electric meter; and
        a voltage-limiter device comprising a gas discharge tube (GDT) in a circuit between the first connector and the second connector, the GDT configured to form a conductive path between the first connector and the second connector in parallel with the customer premises associated with the electric meter,
        wherein the GDT of the voltage-limiter device is further configured to clamp a voltage between the first load-side terminal and the second load-side terminal of the electric meter at a trigger voltage to prevent a voltage greater than the trigger voltage from reaching the electric meter when an external voltage greater than the trigger voltage is applied to the load side of the electric meter, and
        wherein the GDT of the voltage-limiter device provides the conductive path in parallel with the customer premises associated with the electric meter when the voltage between first connector and the second connector reaches the trigger voltage.

9. The system of claim 8, wherein the protection system is configured to maintain the open state of the service-disconnect switch of the electric meter in a presence of the voltage greater than the trigger voltage being applied to the load side of the electric meter.

10. The system of claim 9, wherein the voltage-limiter device is configured to cause a short circuit in a tamper device applied between the first load-side terminal and the second load-side terminal of the electric meter.

11. The system of claim 9, wherein the voltage-limiter device comprises one or more varistors.

12. The system of claim 8, wherein:
the voltage-limiter device of the protection system further comprises an additional GDT in parallel with the GDT; and
the GDT is configured to fail in an open position, wherein the additional GDT provides a second conductive path for the current in parallel with the customer premises associated with the electric meter when the GDT fails.

13. The system of claim 8, wherein the protection system is installed outside a housing of the electric meter.

14. The system of claim 8, wherein the protection system is installed inside a housing of the electric meter.

15. The system of claim 8, wherein the electric meter is a cabinet meter configured for installation in a cabinet with multiple other electric meters.

16. The system of claim 8, wherein the electric meter is an American National Standards Institute (ANSI) electric meter.

17. A method for protecting an electric meter, the method comprising:
receiving a disconnect command at the electric meter;
opening a service-disconnect switch of the electric meter responsive to the disconnect command;
clamping, by a gas discharge tube (GDT) of a voltage-limiter device of a protection system connected by a first connector to a first load-side terminal of the electric meter and by a second connector to a second load-side terminal of the electric meter, a voltage between the first load-side terminal and the second load-side terminal at a trigger voltage to prevent a voltage greater than the trigger voltage from reaching the electric meter when an external voltage greater than the trigger voltage is applied to a load side of the electric meter; and
providing, by the GDT of the voltage-limiter device of the protection system, a conductive path between the first load-side terminal and the second load-side terminal and in parallel with a customer premises associated with the electric meter when a voltage between the first connector and the second connector reaches the trigger voltage.

18. The method of claim 17, wherein:
the voltage-limiter device comprises an additional GDT connected in parallel with GDT;
the GDT is configured to fail in an open position; and
the additional GDT is configured to provide a second conductive path in parallel with the customer premises associated with the electric meter when the GDT fails.

* * * * *